(12) United States Patent
Toda (10) Patent No.: US 10,356,893 B1
(45) Date of Patent: Jul. 16, 2019

(54) CIRCUIT BOARD, CONNECTOR ASSEMBLY AND CABLE HARNESS

(71) Applicant: Japan Aviation Electronics Industry, Limited, Tokyo (JP)

(72) Inventor: Kentaro Toda, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 16/174,665

(22) Filed: Oct. 30, 2018

(30) Foreign Application Priority Data

Dec. 25, 2017 (JP) ................................ 2017-247425

(51) Int. Cl.
*H05K 1/02* (2006.01)
*H01R 12/53* (2011.01)
*H01R 12/72* (2011.01)

(52) U.S. Cl.
CPC ......... *H05K 1/0222* (2013.01); *H05K 1/0228* (2013.01); *H01R 12/53* (2013.01); *H01R 12/722* (2013.01); *H05K 2201/09027* (2013.01); *H05K 2201/09227* (2013.01); *H05K 2201/09236* (2013.01); *H05K 2201/09272* (2013.01); *H05K 2201/09618* (2013.01)

(58) Field of Classification Search
CPC .... H05K 1/0222; H05K 1/0228; H01R 12/53; H01R 12/722
USPC .......................................................... 439/78
See application file for complete search history.

(56) References Cited

U.S. PATENT DOCUMENTS

| 5,818,315 | A | * | 10/1998 | Moongilan | ............... | H01P 3/08 333/238 |
| 6,486,755 | B2 | * | 11/2002 | Aruga | .................... | H01P 1/047 333/246 |
| 6,700,789 | B2 | * | 3/2004 | Shirasaki | ................ | H01P 1/047 174/255 |
| 7,301,418 | B2 | | 11/2007 | Kanno et al. | | |
| 7,317,166 | B2 | * | 1/2008 | Nakamura | ........... | H05K 1/0222 174/254 |
| 7,378,919 | B2 | * | 5/2008 | Zimmerling | .............. | H01P 1/02 333/1 |
| 8,013,427 | B2 | * | 9/2011 | Maetani | ............... | H05K 1/0245 174/261 |

(Continued)

FOREIGN PATENT DOCUMENTS

| JP | 2004-014800 A | 1/2004 |
| JP | 3954641 B2 | 8/2007 |

(Continued)

*Primary Examiner* — Alexander Gilman
(74) *Attorney, Agent, or Firm* — Collard & Roe, P.C.

(57) ABSTRACT

A circuit board comprises at least a first wiring layer, a second wiring layer and a via. The first wiring layer is formed with a pair of first ends, a pair of second ends, a coupling portion, a pair of first trace portions and a pair of second trace portions. The coupling portion has a pair of first coupling points, a pair of second coupling points, an inner trace portion, an outer trace portion and a ground conductor portion. The inner trace portion has a length equal to a length of the outer trace portion. The ground conductor portion is arranged between the inner trace portion and the outer trace portion. The second wiring layer is formed with a ground pattern. The ground conductor portion is connected with the ground pattern through the via.

7 Claims, 6 Drawing Sheets

(56) References Cited

U.S. PATENT DOCUMENTS

| | | | | |
|---|---|---|---|---|
| 8,378,223 B1* | 2/2013 | Shiue | ............... | H05K 1/0245 |
| | | | | 174/250 |
| 8,421,551 B2* | 4/2013 | Lascari | ............... | H01P 1/047 |
| | | | | 174/250 |
| 8,426,743 B2* | 4/2013 | Corisis | ............... | H01L 23/66 |
| | | | | 174/260 |
| 8,552,308 B2* | 10/2013 | Lee | ............... | H05K 1/0245 |
| | | | | 174/255 |
| 8,633,399 B2* | 1/2014 | Kagaya | ............... | H01P 1/02 |
| | | | | 174/250 |
| 8,835,775 B2* | 9/2014 | Fan | ............... | H05K 1/0245 |
| | | | | 174/250 |
| 8,895,872 B2* | 11/2014 | Pai | ............... | H05K 1/11 |
| | | | | 174/250 |
| 9,276,549 B1* | 3/2016 | Cheng | ............... | G06F 17/5077 |
| 9,559,401 B2* | 1/2017 | Kawai | ............... | H01P 3/026 |
| 2004/0189418 A1* | 9/2004 | Bartley | ............... | H01P 3/08 |
| | | | | 333/4 |
| 2007/0063782 A1* | 3/2007 | Kanno | ............... | H01P 3/081 |
| | | | | 333/4 |
| 2007/0222533 A1* | 9/2007 | Lai | ............... | H01P 3/081 |
| | | | | 333/4 |
| 2011/0210803 A1* | 9/2011 | Ou | ............... | H05K 1/0248 |
| | | | | 333/4 |
| 2012/0325542 A1* | 12/2012 | Yokoyama | ............... | H05K 1/0251 |
| | | | | 174/262 |
| 2013/0112470 A1* | 5/2013 | Ao | ............... | H05K 1/0251 |
| | | | | 174/266 |
| 2013/0175077 A1* | 7/2013 | Kim | ............... | H05K 1/0222 |
| | | | | 174/262 |

FOREIGN PATENT DOCUMENTS

| | | |
|---|---|---|
| JP | 2008-010673 A | 1/2008 |
| JP | 2009-224489 A | 10/2009 |
| JP | 2011-165910 A | 8/2011 |
| JP | 2012-199904 A | 10/2012 |
| JP | 2015-138953 A | 7/2015 |

* cited by examiner

CIRCUIT BOARD, CONNECTOR ASSEMBLY AND CABLE HARNESS

CROSS REFERENCE TO RELATED APPLICATIONS

This application is based on and claims priority under 35 U.S.C. § 119 to Japanese Patent Application No. JP2017-247425 filed Dec. 25, 2017, the contents of which are incorporated herein in their entireties by reference.

BACKGROUND OF THE INVENTION

This invention relates to a circuit board, a connector assembly and a cable harness.

Figure 7:
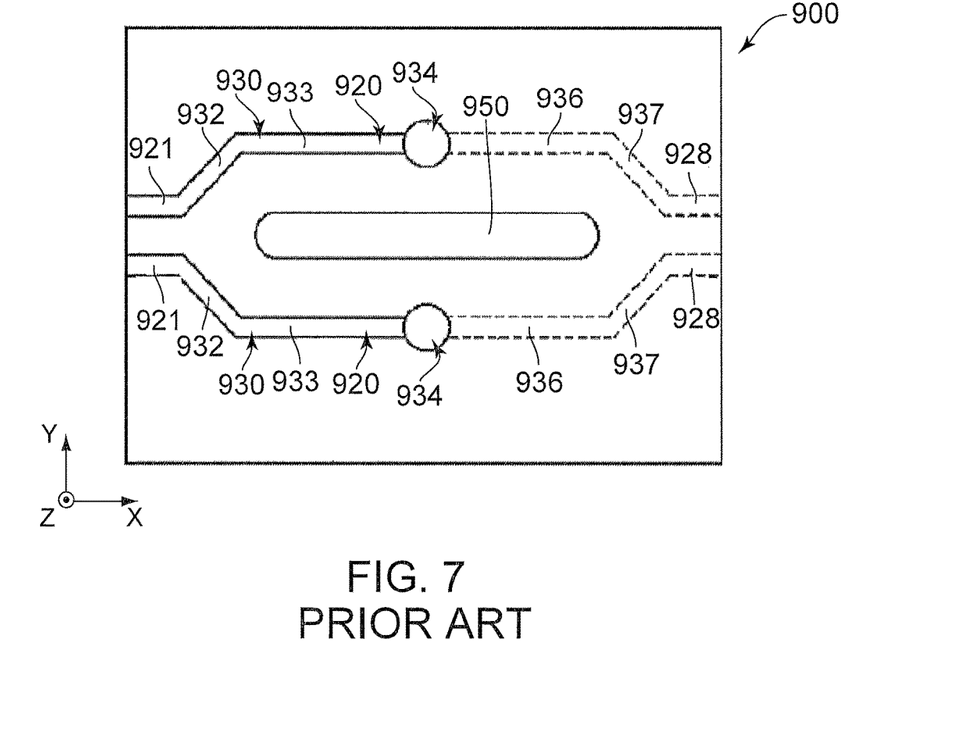
FIG. 7 is a top view showing a circuit board of Patent Document 1.

Referring to FIG. 7, JP-A 2004-14800 (Patent Document 1) discloses a circuit board 900 on which a pair of differential traces 920 is formed. The differential traces 920 have a pair of first trace portions 921, a pair of second trace portions 928 and a coupling portion 930. The first trace portions 921, the coupling portion 930 and the second trace portions 928 are coupled in this order. The coupling portion 930 has a pair of first coupling portions 932, a pair of third trace portions 933, a pair of through holes 934, a pair of fourth trace portions 936 and a pair of second coupling portions 937. The coupling portion 930 is configured that the first coupling portions 932, the third trace portions 933, the through holes 934, the fourth trace portions 936 and the second coupling portions 937 are coupled in this order. In a Y-direction, the first trace portions 921 are spaced apart from each other by a first distance while the second trace portions 928 are spaced apart from each other by a second distance. If, in the Y-direction, the third trace portions 933 are arranged apart from each other by a distance equal to the first distance while the fourth trace portions 936 are arranged apart from each other by a distance equal to the second distance, the existence of the through hole 934 reduces a differential impedance of a line from the third trace portion 933 to the fourth trace portion 936 as compared with any of a differential impedance of the first trace portion 921 and a differential impedance of the second trace portion 928. This reduction causes impedance mismatch between the coupling portion 930 and each of the pair of the first trace portions 921 and the pair of the second trace portions 928. On the contrary, the differential traces 920 of Patent Document 1 are provided with the first coupling portions 932 and the second coupling portions 937 so that the third trace portions 933 are arranged apart from each other by a distance greater than the first distance while the fourth trace portions 936 are arranged apart from each other by a distance greater than the second distance. This arrangement increases the differential impedance of the line from the third trace portion 933 to the fourth trace portion 936 to prevent impedance mismatch between the coupling portion 930 and each of the pair of the first trace portions 921 and the pair of the second trace portions 928. Additionally, if the differential impedance of the line from the third trace portion 933 to the fourth trace portion 936 is greater than expected, the differential impedance can be adjustably reduced by arranging a conductive member 950, as shown in FIG. 7, between the lines each consisting of the third trace portion 933, the through hole 934 and the fourth trace portion 936.

There is a demand for a cable harness, which comprises a circuit board provided with a pair of differential traces, to enable a mating direction, in which the cable harness is mateable with a mating connector, to be perpendicular to an extending direction in which a cable mainly extends. If a cable, which is composed of a plurality of single wires, is bent so that the extending direction is forced to be perpendicular to the mating direction, the cable largely protrudes outside a connector assembly so that the cable harness as a whole has an increased size. Accordingly, the cable harness having this structure is unfavorable.

One possible approach for arranging the mating direction to be perpendicular to the extending direction without the cable harness having an increased size is to bend the differential traces, which are formed on the circuit board, to L-shape. However, if the differential traces on the circuit board are modified to be simply bent to L-shape to be arranged parallel to each other, an inner trace of the modified differential traces is shorter than an outer trace of the modified differential traces. Accordingly, skew occurs between a differential signal pair which passes through the modified differential traces, and thereby a transmission error occurs. One possible approach for reducing occurrence of the skew is to remodel a part of a shape of the inner trace which is positioned at a bending region of the modified differential traces so that the inner trace and the outer trace have the same length.

If the inner trace is remodeled as described above, no skew occurs between a differential signal pair which passes through the remodeled differential traces. However, the remodeled shape of the inner trace distorts differential signals to cause unnecessary mode conversion where some of differential-mode signals are converted to common-mode signals. Specifically, the remodeled differential traces have a drawback to cause differential to common-mode conversion.

SUMMARY OF THE INVENTION

It is therefore an object of the present invention to provide a circuit board which reduces occurrence of skew and minimizes deterioration of differential to common-mode conversion.

Through trial and error, the present applicant has been found that both reduction of skew occurrence and minimization of deterioration of differential to common-mode conversion can be realized by preventing electrical interaction between the differential traces at a bending region of the differential traces where differential signals might be distorted. In the thus-formed structure, differential signals, which pass through the differential traces, are transmitted as quasi-single ended signals, respectively. The present invention is based on this finding.

One aspect (first aspect) of the present invention provides a circuit board for electrically connecting between a first connecting object and a second connecting object. The circuit board comprises at least a first wiring layer, a second wiring layer and a via. The first wiring layer is formed with a pair of first ends, a pair of second ends, a coupling portion, a pair of first trace portions and a pair of second trace portions. The first ends are configured to be connected with the first connecting object. The second ends are configured to be connected with the second connecting object. The coupling portion has a pair of first coupling points, a pair of second coupling points, an inner trace portion, an outer trace portion and a ground conductor portion. The inner trace portion and the outer trace portion are connected between the first coupling points and the second coupling points, respectively. The inner trace portion has a length equal to a length of the outer trace portion. The ground conductor portion is arranged between the inner trace portion and the outer trace portion. The first trace portions connect between the first ends and the first coupling points, respectively. The first trace portions have lengths equal to each other. The first trace portions extend parallel to each other with a first trace distance left therebetween. The first trace portions start to extend from the first coupling points, respectively, in a predetermined direction. The second trace portions connect between the second ends and the second coupling points, respectively. The second trace portions have lengths equal to each other. The second trace portions extend parallel to each other with a second trace distance left therebetween. The second trace portions start to extend from the second coupling points, respectively, in a direction intersecting with the predetermined direction. The second wiring layer is formed with a ground pattern. The ground conductor portion is connected with the ground pattern through the via.

Another aspect (second aspect) of the present invention provides a connector assembly comprising the circuit board of the first aspect and a connector which functions as the first connecting object. The connector comprises a plurality of terminals. The first ends are connected with the terminals of the connector.

Still another aspect (third aspect) of the present invention provides a cable harness comprising the connector assembly of the second aspect and a cable which functions as the second connecting object. The cable is connected with the second ends.

The circuit board of the present invention is configured as follows; the first trace portions have the lengths equal to each other, the inner trace portion has the length equal to the length of the outer trace portion, and the second trace portions have the lengths equal to each other. Since this configuration provides that differential traces of a pair of the present invention have lengths equal to each other, occurrence of skew is reduced between the differential traces. In addition, the ground conductor portion, which is connected through the via (via hole) with the ground pattern formed on the second wiring layer, is arranged between the inner trace portion and the outer trace portion. The thus-arranged ground conductor portion prevents electrical interaction between the inner trace portion and the outer trace portion, so that differential signals, which pass through the inner trace portion and the outer trace portion, are transmitted as quasi-single ended signals, respectively. Accordingly, deterioration of differential to common-mode conversion is minimized. Thus, the circuit board of the present invention can realize both reduction of skew occurrence and minimization of deterioration of differential to common-mode conversion.

An appreciation of the objectives of the present invention and a more complete understanding of its structure may be had by studying the following description of the preferred embodiment and by referring to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 1:
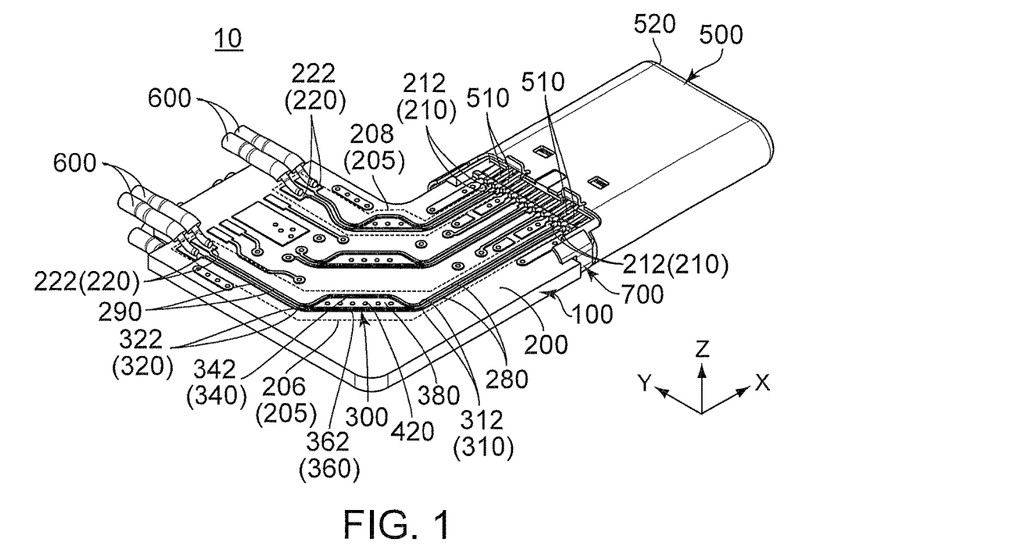
FIG. 1 is a perspective view showing a cable harness according to an embodiment of the present invention. In the figure, a cable included in the cable harness is simply illustrated.

As shown in FIG. 1, a cable harness 10 according to an embodiment of the present invention comprises a connector assembly 700 and a cable 600. The cable 600 functions as a second connecting object 600. Although the cable 600 shown in FIG. 1 is simply illustrated as a plurality of insulated single wires, an actual cable 600 is a multi-conductor cable. Specifically, the actual cable 600 comprises a plurality of insulated single wires, which are bundled together, and an outer cover covering the bundled insulated single wires.

As shown in FIG. 1, the connector assembly 700 of the present embodiment comprises a connector 500 and a circuit board 100. The connector 500 functions as a first connecting object 500.

Referring to FIG. 1, the connector 500 of the present embodiment is mateable with a mating connector (not shown) along a mating direction. In the present embodiment, the mating direction is an X-direction. As shown in FIG. 1, the connector 500 of the present embodiment comprises a plurality of terminals 510 and a mating portion 520. Each of the terminals 510 is connected with the circuit board 100 at a negative X-side end of the connector 500. The mating portion 520 is opened at a positive X-side end of the connector 500.

As shown in FIG. 1, the circuit board 100 of the present embodiment is configured to electrically connect between the connector 500, or the first connecting object 500, and the cable 600, or the second connecting object 600.

Figure 3:
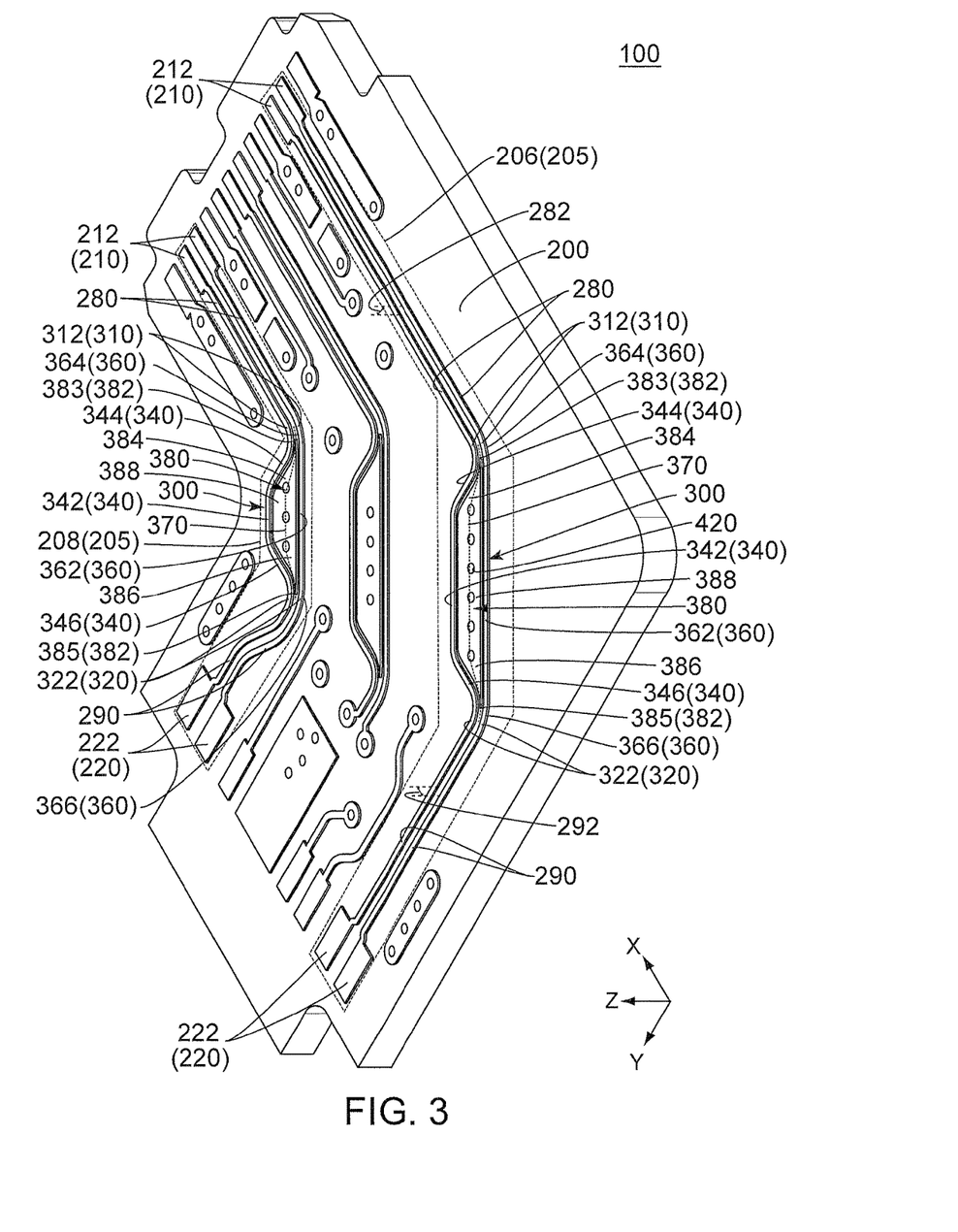
FIG. 3 is a perspective view showing the circuit board of FIG. 2.
Figure 4:
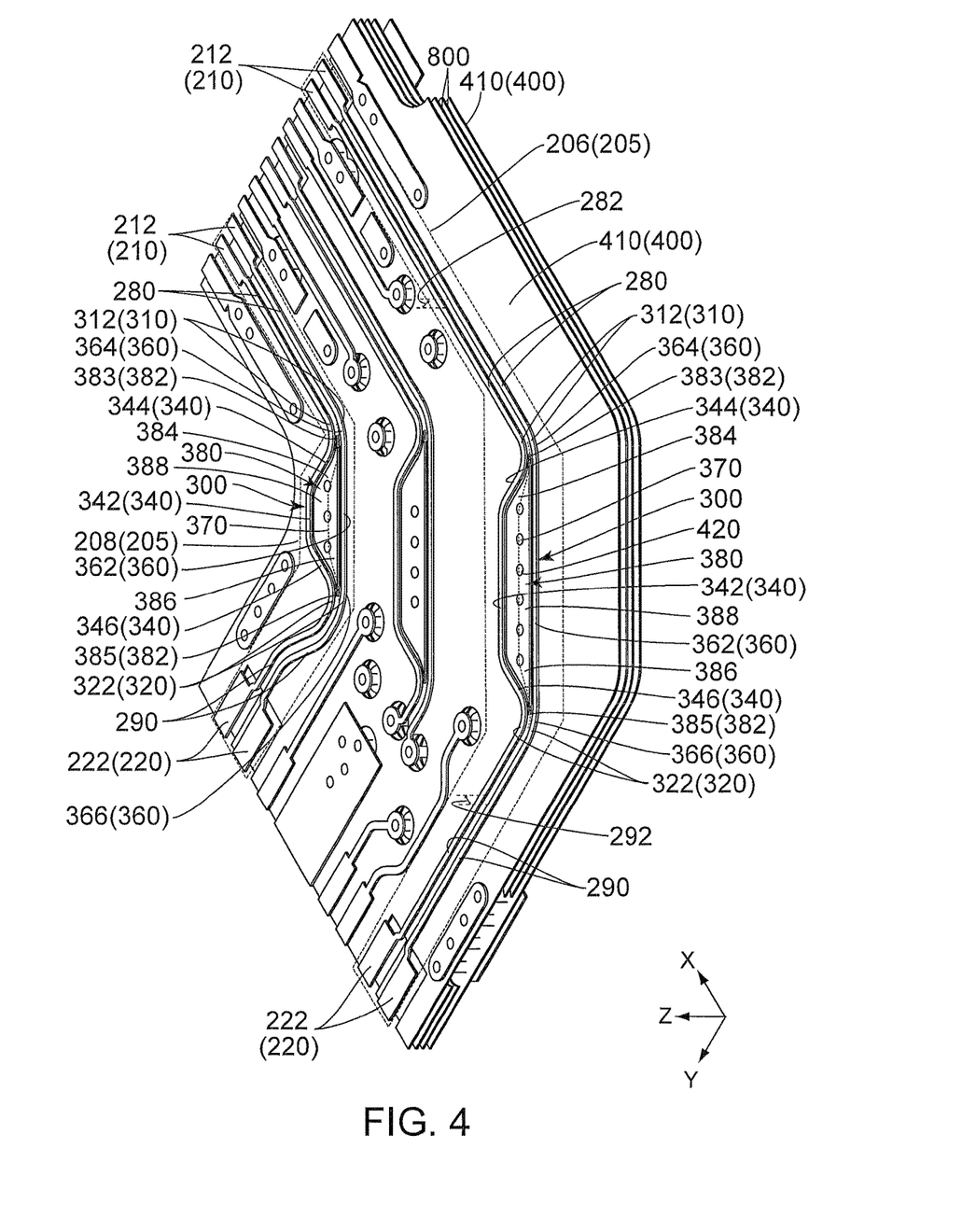
FIG. 4 is a perspective view showing a layer structure of copper layers which are included in the circuit board of FIG. 3.

Referring to FIGS. 3 and 4, the circuit board 100 of the present embodiment is a six-layered board. Specifically, the circuit board 100 of the present embodiment has six copper layers which include a first to a sixth layers. Dielectric layers each between adjacent copper layers are omitted in FIG. 4.

More specifically, referring to FIGS. 3 and 4, the circuit board 100 of the present embodiment comprises two first wiring layers 200, two second wiring layers 400, a plurality of vias 420 and two third wiring layers 800. Each of the vias 420 of the present embodiment is a via hole. Each of the third wiring layers 800 of the present embodiment functions as a power layer. The first wiring layer 200 is positioned outward beyond the second wiring layer 400 in an up-down direction perpendicular to the mating direction. The second wiring layer 400 is positioned outward beyond the third wiring layer 800 in the up-down direction. In the present embodiment, the up-down direction is a Z-direction. The first layer and the sixth layer of the copper layers of the circuit board 100 correspond to the two first wiring layers 200, respectively. The second layer and the fifth layer of the copper layers of the circuit board 100 correspond to the two second wiring layers 400, respectively. The third layer and the fourth layer of the copper layers of the circuit board 100 correspond to the two third wiring layers 800, respectively.

Figure 2:
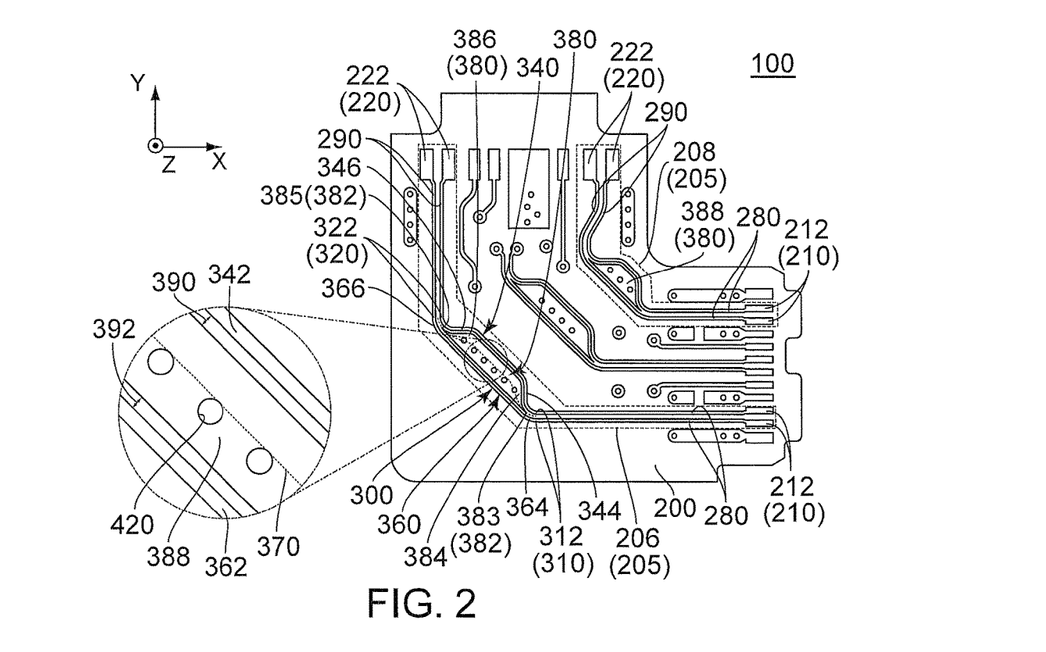
FIG. 2 is a top view showing a circuit board which is included in the cable harness of FIG. 1. In the figure, a part of a pair of differential traces is illustrated enlarged.

As shown in FIGS. 2 and 3, each of the first wiring layers 200 of the present embodiment extends in a plane which is defined by the mating direction and a perpendicular direction. In the present embodiment, the perpendicular direction is a direction perpendicular to both the mating direction and the up-down direction. Specifically, the perpendicular direction of the present embodiment is a Y-direction.

As shown in FIG. 3, the first wiring layer 200 of the present embodiment is formed with two pairs each consisting of differential traces 205. FIG. 3 also shows a pair of differential traces which is positioned between the two pairs of the differential traces 205 and through which signals pass between a pair of first ends 210 of the first wiring layer 200 positioned at a positive Z-side of the circuit board 100 and a pair of second ends 220 of the first wiring layer 200 positioned at a negative Z-side of the circuit board 100. The two pairs of the differential traces 205 include a pair of differential traces 206 and a pair of differential traces 208. Each pair of the differential traces 206, 208 has a pair of first ends 210, a pair of second ends 220, a coupling portion 300, a pair of first trace portions 280 and a pair of second trace portions 290. Specifically, the first ends 210 constitute one pair, and the second ends 220 constitute one pair. However, the present invention is not limited thereto. It is sufficient that the first wiring layer 200 is formed with at least one pair of the differential traces 205. In other words, it is sufficient that the first wiring layer 200 is formed with the pair of the first ends 210, the pair of the second ends 220, the coupling portion 300, the pair of the first trace portions 280 and the pair of the second trace portions 290.

As shown in FIG. 2, the first ends 210 of the present embodiment are arranged in the perpendicular direction. As shown in FIG. 1, the first ends 210 of the present embodiment are connected with the terminals 510 of the connector 500. The pair of the first ends 210 of the differential traces 205 of each pair consists of two first ends 212. One of the two first ends 212 is positioned at a positive Y-side of the pair of the first ends 210. A remaining one of the two first ends 212 is positioned at a negative Y-side of the pair of the first ends 210.

As shown in FIG. 2, the second ends 220 of the present embodiment are arranged in the mating direction. As shown in FIG. 1, the second ends 220 of the present embodiment are connected with the second connecting object 600, or with the cable 600. Referring to FIG. 2 again, the pair of the second ends 220 of the differential traces 205 of each pair consists of two second ends 222. One of the two second ends 222 is positioned at a positive X-side of the pair of the second ends 220. A remaining one of the two second ends 222 is positioned at a negative X-side of the pair of the second ends 220.

As shown in FIG. 3, the coupling portion 300 of the present embodiment has a pair of first coupling points 310, a pair of second coupling points 320, an inner trace portion 340, an outer trace portion 360 and a ground conductor portion 380. Specifically, the first coupling points 310 constitute one pair, and the second coupling points 320 constitute one pair.

Figure 6:
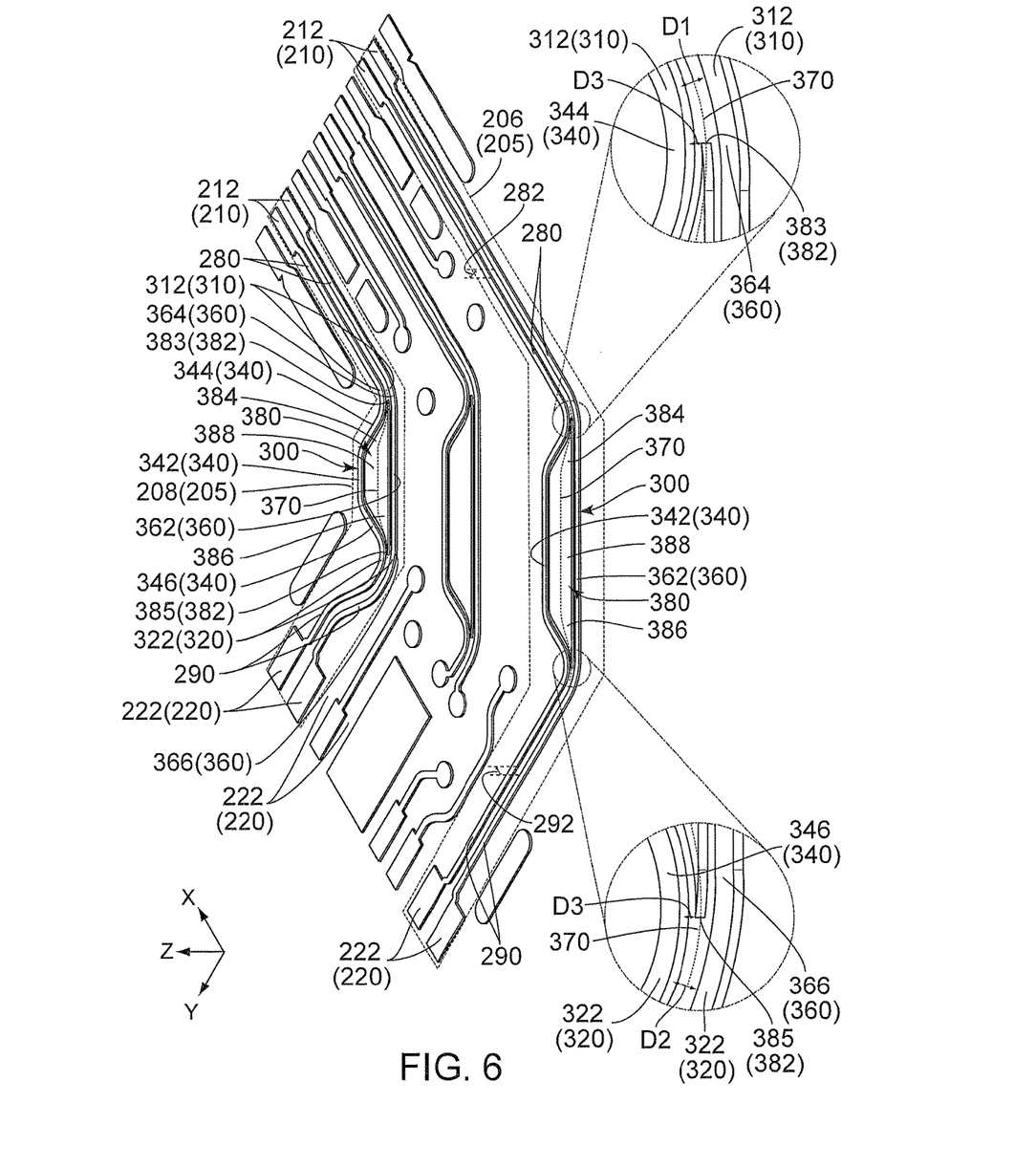
FIG. 6 is a perspective view showing the first layer of the copper layers of FIG. 5. In the figure, parts of the differential traces are illustrated enlarged.

As shown in FIG. 3, each of the first coupling points 310 of the present embodiment is a positive X-side end of the coupling portion 300. The first coupling points 310 consist of two first coupling points 312. One of the two first coupling points 312 is positioned at a positive Y-side of the pair of the first coupling points 310. A remaining one of the two first coupling points 312 is positioned at a negative Y-side of the pair of the first coupling points 310. Referring to FIG. 6, the first coupling points 310 of the present embodiment are spaced apart from each other by a distance D1. In other words, the two first coupling points 312 are spaced apart from each other by the distance D1.

As shown in FIG. 3, each of the second coupling points 320 of the present embodiment is a positive Y-side end of the coupling portion 300. The second coupling points 320 consist of two second coupling points 322. One of the two second coupling points 322 is positioned at a positive X-side of the pair of the second coupling points 320. A remaining one of the two second coupling points 322 is positioned at a negative Y-side of the pair of the second coupling points 320. Referring to FIG. 6, the second coupling points 320 of the present embodiment are spaced apart from each other by a distance D2. In other words, the two second coupling points 322 are spaced apart from each other by the distance D2. The distance D1 of the first coupling points 310 and the distance D2 of the second coupling points 320 of the present embodiment satisfy D1=D2. In other words, the distance D1 of the first coupling points 310 and the distance D2 of the second coupling points 320 are equal to each other.

As shown in FIG. 3, the inner trace portion 340 of the present embodiment is connected between the first coupling point 310 and the second coupling point 320. More specifically, the inner trace portion 340 of the present embodiment is connected between the first coupling point 312, which is positioned at the positive Y-side thereof, and the second coupling point 322 positioned at the positive X-side thereof.

As shown in FIG. 2, the inner trace portion 340 of the present embodiment has a first inner bent portion 344, an inner linear portion 342 and a second inner bent portion 346.

As shown in FIG. 2, the first inner bent portion 344 connects the first coupling point 312, which is positioned at the positive Y-side thereof, and the inner linear portion 342 with each other.

As shown in FIG. 2, the inner linear portion 342 of the present embodiment has a linear shape. The inner linear portion 342 of the present embodiment connects the first inner bent portion 344 and the second inner bent portion 346 with each other. More specifically, the inner linear portion 342 of the present embodiment extends in a negative X-direction and in a positive Y-direction from a positive Y-side end of the first inner bent portion 344. The inner linear portion 342 of the present embodiment is connected with a positive X-side end of the second inner bent portion 346.

As shown in FIG. 2, the second inner bent portion 346 of the present embodiment connects the inner linear portion 342 and the second coupling point 322, which is positioned at the positive X-side thereof, with each other.

As shown in FIG. 3, the outer trace portion 360 of the present embodiment is connected between the first coupling point 310 and the second coupling point 320. More specifically, the outer trace portion 360 of the present embodiment is connected between the first coupling point 312, which is positioned at the negative Y-side thereof, and the second coupling point 322 positioned at the negative X-side thereof.

As shown in FIG. 2, the outer trace portion 360 of the present embodiment has a first outer bent portion 364, an outer linear portion 362 and a second outer bent portion 366.

As shown in FIG. 2, the first outer bent portion 364 of the present embodiment connects the first coupling point 312, which is positioned at the negative Y-side thereof, and the outer linear portion 362 with each other.

As shown in FIG. 2, the outer linear portion 362 of the present embodiment has a linear shape. The outer linear portion 362 of the present embodiment connects the first outer bent portion 364 and the second outer bent portion 366 with each other. More specifically, the outer linear portion 362 of the present embodiment extends in the negative X-direction and in the positive Y-direction from a positive Y-side end of the first outer bent portion 364. The outer linear portion 362 of the present embodiment is connected with a positive X-side end of the second outer bent portion 366.

As shown in FIG. 2, in the present embodiment, the inner linear portion 342 and the outer linear portion 362 extend parallel to each other. The outer linear portion 362 is longer than the inner linear portion 342.

As shown in FIG. 2, the second outer bent portion 366 of the present embodiment connects the outer linear portion 362 and the second coupling point 322, which is positioned at the negative X-side thereof, with each other.

Referring to FIGS. 2 and 3, in the present embodiment, the inner trace portion 340 has a length equal to a length of the outer trace portion 360.

As shown in FIGS. 2 and 3, the ground conductor portion 380 of the present embodiment is arranged between the inner trace portion 340 and the outer trace portion 360. In the present embodiment, the ground conductor portion 380, the inner trace portion 340 and the outer trace portion 360 are positioned on a common plane perpendicular to the up-down direction.

Since the inner trace portion 340 has the inner linear portion 342 having the linear shape while the outer trace portion 360 has the outer linear portion 362 having the linear shape as described above, the first coupling points 310 are connected with the second coupling points 320 by shortest distances, respectively, while the ground conductor portion 380 is arranged between the inner trace portion 340 and the outer trace portion 360. Accordingly, the differential traces 205 occupy a minimum area of the first wiring layer 200 of the circuit board 100.

As shown in FIGS. 2 and 3, the ground conductor portion 380 of the present embodiment has two end portions 382, a first triangular portion 384, a second triangular portion 386 and a body portion 388.

As shown in FIG. 2, the two end portions 382 of the present embodiment are positioned at opposite ends, respectively, of the ground conductor portion 380 in the mating direction. The two end portions 382 of the present embodiment are positioned at opposite ends, respectively, of the ground conductor portion 380 in the perpendicular direction.

Referring to FIG. 6, each of the two end portions 382 of the present embodiment is positioned at an imaginary middle line 370. Specifically, the imaginary middle line 370 is equidistant from the inner trace portion 340 and the outer trace portion 360 while connecting a middle point of the first coupling points 310 to a middle point of the second coupling points 320. D1, D2, and D3 satisfy D1/2≥D3, where D3 is a distance between the inner trace portion 340 and the end portion 382. Since the distance D1 of the first coupling points 310 and the distance D2 of the second coupling points 320 are equal to each other as described above, D2 and D3 satisfy D2/2≥D3.

More specifically, as shown in FIG. 6, the two end portions 382 of the present embodiment include a first end portion 383 and a second end portion 385. In detail, the first end portion 383 is positioned at a positive X-side of the ground conductor portion 380, while the second end portion 385 is positioned at a negative X-side of the ground conductor portion 380.

Referring to FIG. 6, the first end portion 383 of the present embodiment is positioned between the first inner bent portion 344 of the inner trace portion 340 and the first outer bent portion 364 of the outer trace portion 360. The first end portion 383 is spaced apart from the first inner bent portion 344 of the inner trace portion 340 by the distance D3. The first end portion 383 is spaced apart from the first outer bent portion 364 of the outer trace portion 360 by the distance D3.

As shown in FIG. 6, the second end portion 385 of the present embodiment is positioned between the second inner bent portion 346 of the inner trace portion 340 and the second outer bent portion 366 of the outer trace portion 360. The second end portion 385 is spaced apart from the second inner bent portion 346 of the inner trace portion 340 by the distance D3. The second end portion 385 is spaced apart from the second outer bent portion 366 of the outer trace portion 360 by the distance D3.

As shown in FIG. 2, each of the first triangular portion 384 and the second triangular portion 386 of the present embodiment has a substantially triangular shape when viewed along the up-down direction. The first triangular portion 384 is positioned between the first inner bent portion 344 of the inner trace portion 340 and the outer trace portion 360. The first end portion 383 is a positive X-side end of the first triangular portion 384. The second triangular portion 386 is positioned between the second inner bent portion 346 of the inner trace portion 340 and the outer trace portion 360. The second end portion 385 is a negative X-side end of the second triangular portion 386.

Referring to FIG. 6, in the present embodiment, a distance between the first triangular portion 384 and the first inner bent portion 344 slightly increases from the first end portion 383 toward the body portion 388, while a distance between the second triangular portion 386 and the second inner bent portion 346 slightly increases from the second end portion 385 toward the body portion 388. Accordingly, a distance between the inner linear portion 342 and the body portion 388 is shorter than the distance D1 and is longer than a half of the distance D1.

As shown in FIG. 2, the body portion 388 of the present embodiment has a substantially rectangular shape when viewed along the up-down direction. The body portion 388 is positioned between the first triangular portion 384 and the second triangular portion 386. Specifically, the body portion 388 connects the first triangular portion 384 and the second triangular portion 386 with each other.

As shown in FIG. 2, the inner trace portion 340 of the present embodiment is spaced apart from the ground conductor portion 380 by a first distance 390 in a direction perpendicular to a direction in which the inner trace portion 340 extends. More specifically, the inner linear portion 342 of the inner trace portion 340 of the present embodiment is spaced apart from the body portion 388 of the ground conductor portion 380 by the first distance 390 in a direction perpendicular to a direction in which the inner linear portion 342 extends.

As shown in FIG. 2, the outer trace portion 360 of the present embodiment is spaced apart from the ground conductor portion 380 by a second distance 392 in a direction perpendicular to a direction in which the outer trace portion 360 extends. More specifically, the outer linear portion 362 of the outer trace portion 360 of the present embodiment is spaced apart from the body portion 388 of the ground conductor portion 380 by the second distance 392 in a direction perpendicular to a direction in which the outer linear portion 362 extends.

As shown in FIG. 3, in the present embodiment, the first trace portions 280 connect between the first ends 210 and the first coupling points 310, respectively. The first trace portions 280 have lengths equal to each other. The first trace portions 280 extend parallel to each other with a first trace distance 282 left therebetween. In other words, the first trace portions 280 extend parallel to each other while being spaced apart from each other by the first trace distance 282. The first trace portions 280 start to extend from the first coupling points 310, respectively, in a predetermined direction. In the present embodiment, the predetermined direction is the X-direction.

More specifically, as shown in FIG. 3, the first trace portions 280 of the present embodiment include a first trace portion 280, which is positioned at a positive Y-side of the pair of the first trace portions 280, and a first trace portion 280 positioned at a negative Y-side of the pair of the first trace portions 280. The first trace portion 280 at the positive Y-side thereof connects between the first end 212, which is positioned at the positive Y-side thereof, and the first coupling point 312 positioned at the positive Y-side thereof. The first trace portion 280 at the negative Y-side thereof connects between the first end 212, which is positioned at the negative Y-side thereof, and the first coupling point 312 positioned at the negative Y-side thereof. The first trace portion 280 at the positive Y-side thereof starts to extend in the predetermined direction from the first coupling point 312 positioned at the positive Y-side thereof. The first trace portion 280 at the negative Y-side thereof starts to extend in the predetermined direction from the first coupling point 312 positioned at the negative Y-side thereof.

As shown in FIG. 3, in the present embodiment, the second trace portions 290 connect between the second ends 220 and the second coupling points 320, respectively. The second trace portions 290 have lengths equal to each other. The second trace portions 290 extend parallel to each other with a second trace distance 292 left therebetween. In other words, the second trace portions 290 extend parallel to each other while being spaced apart from each other by the second trace distance 292. The second trace portions 290 start to extend from the second coupling points 320, respectively, in the perpendicular direction perpendicular to the predetermined direction. However, the present invention is not limited thereto. Each of the second trace portions 290 may start to extend in a direction intersecting with the predetermined direction from the second coupling point 320 corresponding thereto.

Referring to FIG. 3, in the present embodiment, the first trace distance 282 is equal to the second trace distance 292. Referring to FIGS. 3 and 6, the first trace distance 282 is equal to any of the distance D1 of the first coupling points 310 and the distance D2 of the second coupling points 320.

More specifically, as shown in FIG. 3, the second trace portions 290 of the present embodiment include a second trace portion 290, which is positioned at a positive X-side of the pair of the second trace portions 290, and the second trace portion 290 positioned at a negative X-side of the pair of the second trace portions 290. The second trace portion 290 at the positive X-side thereof connects between the second end 222, which is positioned at the positive X-side thereof, and the second coupling point 322 positioned at the positive X-side thereof. The second trace portion 290 at the negative X-side thereof connects between the second end 222, which is positioned at the negative X-side thereof, and the second coupling point 322 positioned at the negative X-side thereof. The second trace portion 290 at the positive X-side thereof starts to extend in the perpendicular direction from the second coupling point 322 positioned at the positive X-side thereof. The second trace portion 290 at the negative X-side thereof starts to extend in the perpendicular direction from the second coupling point 322 positioned at the negative X-side thereof.

As described above, the circuit board 100 of the present invention is configured as follows; the first trace portions 280 have the lengths equal to each other, the inner trace portion 340 has the length equal to the length of the outer trace portion 360, and the second trace portions 290 have the lengths equal to each other. This configuration provides that the differential traces 205 of the pair of the present invention have lengths equal to each other. Accordingly, occurrence of skew is reduced between the differential traces 205 of the pair.

Referring to FIGS. 2 and 3, in the present embodiment, the first distance 390 is shorter than any of the first trace distance 282 and the second trace distance 292. The second distance 392 is shorter than any of the first trace distance 282 and the second trace distance 292. The first distance 390 and the second distance 392 are equal to each other.

Referring to FIG. 4, each of the second wiring layers 400 of the present embodiment extends in the plane which is defined by the mating direction and the perpendicular direction. Each of the second wiring layers 400 of the present embodiment is formed with a ground pattern 410.

Referring to FIG. 4, the ground pattern 410 of the present embodiment at least overlaps with any of the first trace portions 280, the coupling portion 300, the second trace portions 290 and the ground conductor portion 380 in the up-down direction.

Figure 5:
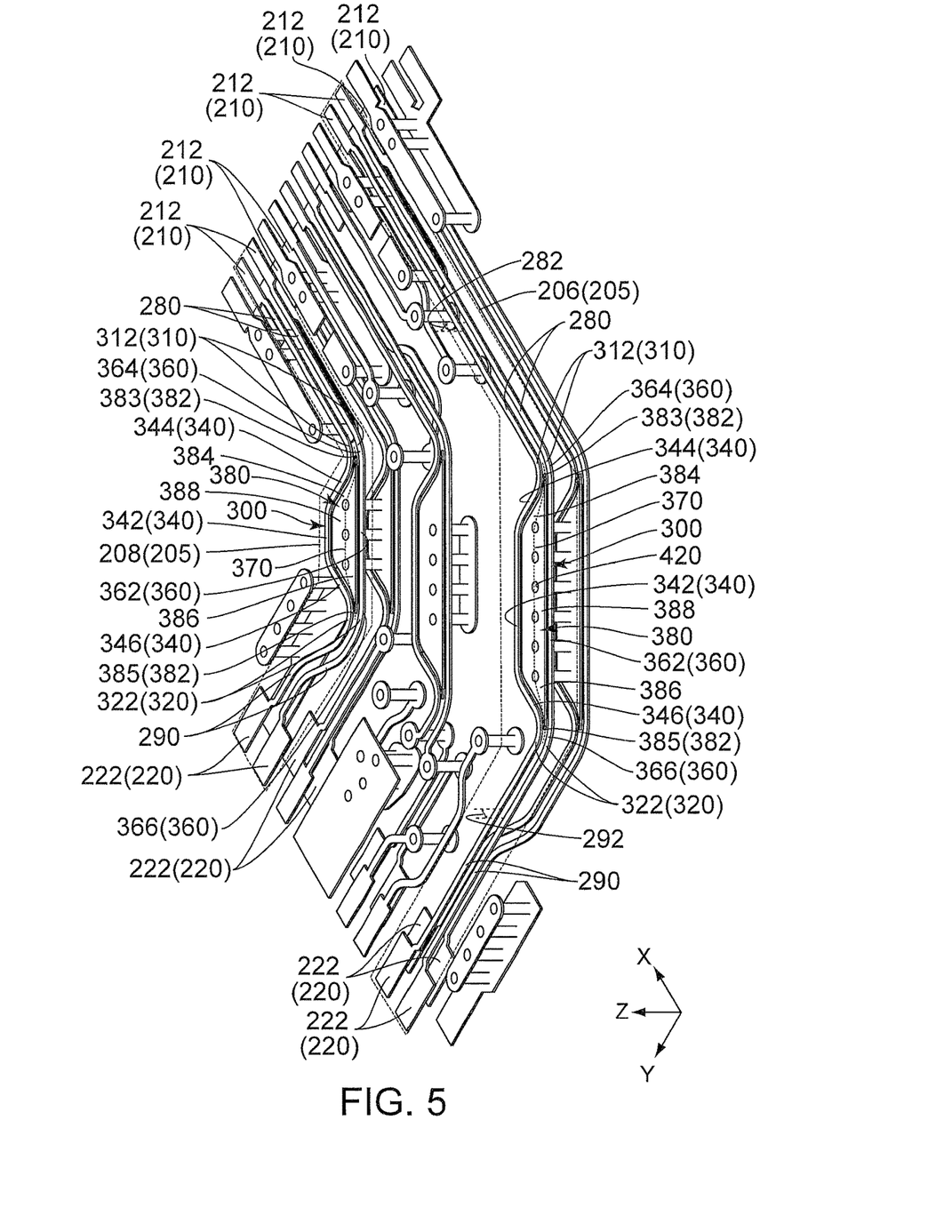
FIG. 5 is a perspective view showing a first layer, a fifth layer and a via of the copper layers of FIG. 4.

As shown in FIG. 5, each of the vias 420 of the present embodiment extends in the up-down direction within the circuit board 100. Each of the vias 420 of the present embodiment connects the ground conductor portion 380 of the first wiring layer 200 and the ground pattern 410 of the second wiring layer 400 with each other. More specifically, the ground conductor portions 380 of the two first wiring layers 200 and the ground patterns 410 of the two second wiring layers 400 are connected with one another through each of the vias 420.

Referring to FIG. 4, each of the third wiring layers 800 extends in the plane which is defined by the mating direction and the perpendicular direction. Each of the third wiring layers 800 is connected with none of the vias 420.

As described above, in the differential traces 205 of the present embodiment, the ground conductor portion 380, which is connected with the ground pattern 410 of the second wiring layer 400 through the via 420, is arranged between the inner trace portion 340 and the outer trace portion 360 of the coupling portion 300. Accordingly, the ground conductor portion 380 prevents electrical interaction between the inner trace portion 340 and the outer trace portion 360, so that differential signals, which pass through the inner trace portion 340 and the outer trace portion 360, are transmitted as quasi-single ended signals, respectively. Thus, deterioration of differential to common-mode conversion is minimized.

Although the specific explanation about the present invention is made above referring to the embodiments, the present invention is not limited thereto and is susceptible to various modifications and alternative forms.

Although the circuit board 100 of the present embodiment comprises the two first wiring layers 200, the two second wiring layers 400 and the two third wiring layers (power layers) 800, the present invention is not limited thereto. Specifically, it is sufficient that the circuit board 100 comprises at least the single first wiring layer 200 and the single second wiring layer 400.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A circuit board for electrically connecting between a first connecting object and a second connecting object, wherein:
   the circuit board comprises at least a first wiring layer, a second wiring layer and a via;
   the first wiring layer is formed with a pair of first ends, a pair of second ends, a coupling portion, a pair of first trace portions and a pair of second trace portions;
   the first ends are configured to be connected with the first connecting object;
   the second ends are configured to be connected with the second connecting object;
   the coupling portion has a pair of first coupling points, a pair of second coupling points, an inner trace portion, an outer trace portion and a ground conductor portion;
   the inner trace portion and the outer trace portion are connected between the first coupling points and the second coupling points, respectively;
   the inner trace portion has a length equal to a length of the outer trace portion;
   the ground conductor portion is arranged between the inner trace portion and the outer trace portion;
   the first trace portions connect between the first ends and the first coupling points, respectively;
   the first trace portions have lengths equal to each other;
   the first trace portions extend parallel to each other with a first trace distance left therebetween;
   the first trace portions start to extend from the first coupling points, respectively, in a predetermined direction;
   the second trace portions connect between the second ends and the second coupling points, respectively;
   the second trace portions have lengths equal to each other;
   the second trace portions extend parallel to each other with a second trace distance left therebetween;
   the second trace portions start to extend from the second coupling points, respectively, in a direction intersecting with the predetermined direction;
   the second wiring layer is formed with a ground pattern; and
   the ground conductor portion is connected with the ground pattern through the via.

2. A connector assembly comprising the circuit board as recited in claim 1 and a connector which functions as the first connecting object, wherein:
   the connector comprises a plurality of terminals; and
   the first ends are connected with the terminals of the connector.

3. The connector assembly as recited in claim 2, wherein:
   the inner trace portion is spaced apart from the ground conductor portion by a first distance in a direction perpendicular to a direction in which the inner trace portion extends;
   the first distance is shorter than any of the first trace distance and the second trace distance;
   the outer trace portion is spaced apart from the ground conductor portion by a second distance in a direction perpendicular to a direction in which the outer trace portion extends;
   the second distance is shorter than any of the first trace distance and the second trace distance; and
   the first distance and the second distance are equal to each other.

4. The connector assembly as recited in claim 2, wherein:
   the inner trace portion has an inner linear portion;
   the outer trace portion has an outer linear portion;
   the inner linear portion and the outer linear portion extend in parallel to each other; and
   the outer linear portion is longer than the inner linear portion.

5. The connector assembly as recited in claim 2, wherein:
   the ground conductor portion has two end portions;
   each of the two end portions is positioned on an imaginary middle line, the imaginary middle line being equidistant from the inner trace portion and the outer trace portion while connecting a middle point of the first coupling points to a middle point of the second coupling points; and
   D1=D2, and D1/2≥D3, where D1 is a distance between the first coupling points, D2 is a distance between the second coupling points, and D3 is a distance between the inner trace portion and the end portion.

6. The connector assembly as recited in claim 2, wherein the ground conductor portion prevents electrical interaction between the inner trace portion and the outer trace portion.

7. A cable harness comprising the connector assembly as recited in claim 2 and a cable which functions as the second connecting object, wherein the cable is connected with the second ends.

* * * * *